US011150190B2

(12) United States Patent
Barak et al.

(10) Patent No.: US 11,150,190 B2
(45) Date of Patent: Oct. 19, 2021

(54) HYBRID METROLOGY METHOD AND SYSTEM

(71) Applicant: NOVA LTD., Rehovot (IL)

(72) Inventors: Gilad Barak, Rehovot (IL); Yanir Hainick, Tel-Aviv (IL); Yonatan Oren, Kiryat Ono (IL)

(73) Assignee: NOVA LTD, Rehovot (IL)

( * ) Notice: Subject to any disclaimer, the term of this patent is extended or adjusted under 35 U.S.C. 154(b) by 0 days.

(21) Appl. No.: 16/945,975

(22) Filed: Aug. 3, 2020

(65) Prior Publication Data

US 2021/0003508 A1    Jan. 7, 2021

Related U.S. Application Data

(63) Continuation of application No. 16/062,127, filed as application No. PCT/IL2016/051350 on Dec. 15, 2016, now Pat. No. 10,732,116.

(60) Provisional application No. 62/267,291, filed on Dec. 15, 2015.

(51) Int. Cl.
| | |
|---|---|
| *G01N 21/65* | (2006.01) |
| *G01B 11/06* | (2006.01) |
| *G01N 21/95* | (2006.01) |
| *G03F 7/20* | (2006.01) |
| *H01L 21/66* | (2006.01) |
| *G01L 1/24* | (2006.01) |

(52) U.S. Cl.
CPC ........ *G01N 21/65* (2013.01); *G01B 11/0666* (2013.01); *G01L 1/24* (2013.01); *G01N 21/658* (2013.01); *G01N 21/9501* (2013.01);

*G03F 7/70625* (2013.01); *H01L 22/12* (2013.01); *G01B 2210/56* (2013.01)

(58) Field of Classification Search
None
See application file for complete search history.

(56) References Cited

U.S. PATENT DOCUMENTS

| | | | | |
|---|---|---|---|---|
| 6,151,119 | A | * 11/2000 | Campion | ........... G01B 11/0666 356/630 |
| 7,903,260 | B1 | * 3/2011 | Janik | ...................... G01N 21/65 356/601 |
| 2002/0109110 | A1 | * 8/2002 | Some | .................. G01N 21/9501 250/559.4 |
| 2016/0097983 | A1 | * 4/2016 | Bogaart | ............... G01N 21/956 250/372 |

* cited by examiner

*Primary Examiner* — Shawn Decenzo
(74) *Attorney, Agent, or Firm* — Alphapatent Associates, Ltd.; Daniel J. Swirsky

(57) ABSTRACT

A method and system are presented for use in measuring characteristic(s) of patterned structures. The method utilizes processing of first and second measured data, wherein the first measured data is indicative of at least one Raman spectrum obtained from a patterned structure under measurements using at least one selected optical measurement scheme each with a predetermined configuration of illuminating and/or collected light conditions corresponding to the characteristic(s) to be measured, and the second measured data comprises at least one spectrum obtained from the patterned structure in Optical Critical Dimension (OCD) measurement session. The processing comprises applying model-based analysis to the at least one Raman spectrum and the at least one OCD spectrum, and determining the characteristic(s) of the patterned structure under measurements.

24 Claims, 5 Drawing Sheets

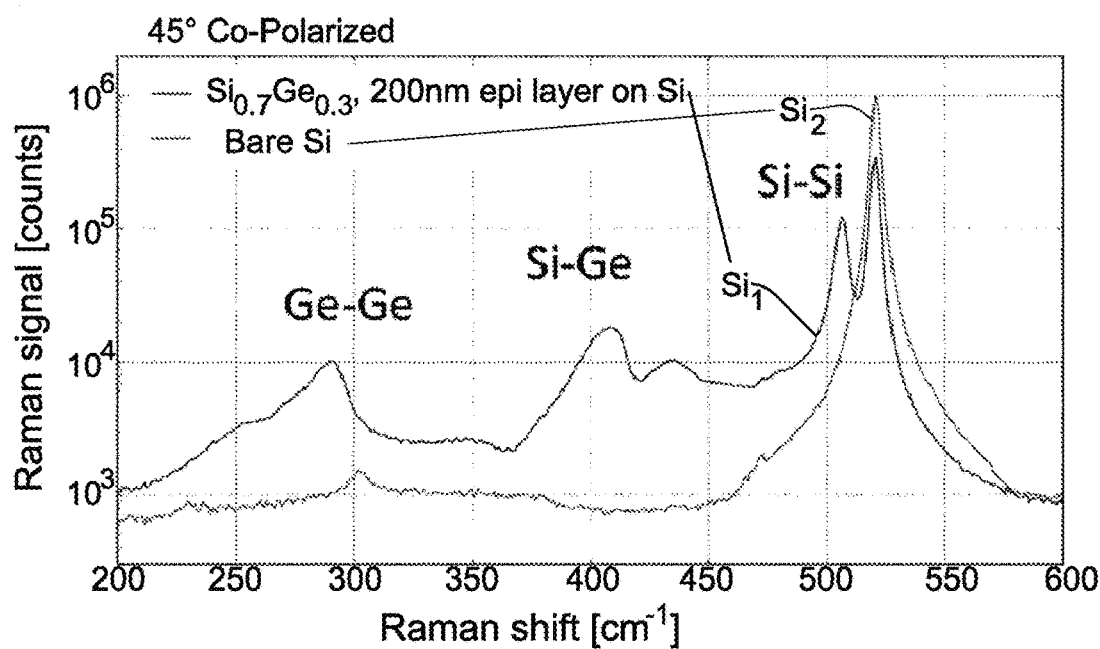
FIG. 1 (General Art)
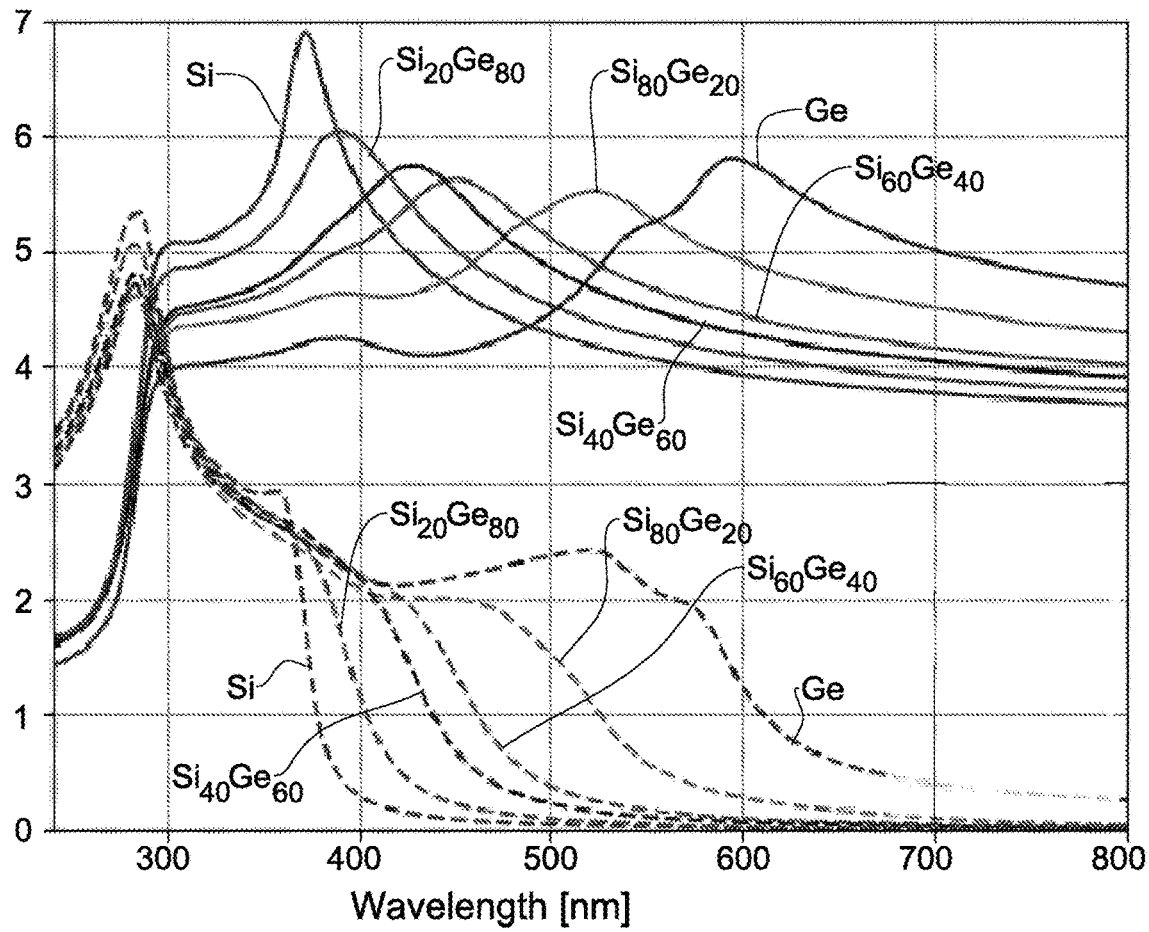
FIG. 2 (General Art)

HYBRID METROLOGY METHOD AND SYSTEM

TECHNOLOGICAL FIELD

The present invention is in the field of metrology techniques, in particular useful for measuring on patterned structures, such as semiconductor wafers. The invention relates to an optical measurement system and method implementing a hybrid metrology technique.

BACKGROUND

The growing complexity of semiconductor device designs in advanced technology nodes, involves both a decrease in structural dimensions and higher complexity of the device design. The mainstream methods for dimensional characterization of such devices are based on optical metrology approaches, broadly termed Optical Critical Dimensions (OCD) metrology. The optical reflectivity of the sample depends on the dimensional characteristics of the measured structure, allowing inference of the measured structure dimensions from the measured signal through appropriate modeling and interpretation tools.

Hybrid Metrology (HM) technique is aimed at improving the accuracy, precision or other metrology performance of measurements by combining information from different toolsets to provide increased metrology performance for complex multi-stack structures of various types, including FinFET devices (i.e. Field Effect transistor in which the conducting channel is wrapped by a thin silicon "fin", which forms the body of the device).

According to the known HM approach, the information measured by a secondary tool set (typically, critical dimensions Scanning Electron Microscopy (CD-SEM)) is used as input constraint on the modeling analysis of a primary toolset (typically, optical critical dimension (OCD)).

For example, WO 2011/158239, assigned to the assignee of the present application, describes a system and method for use in metrology of patterned structures, including data input utility for receiving first type of data indicative of image data on at least a part of the patterned structure, and data processing and analyzing utility configured and operable for analyzing the image data, and determining a geometrical model for at least one feature of a pattern in the structure, and using this geometrical model for determining an optical model for second type of data indicative of optical measurements on a patterned structure. In this technique, optimization of the interpretation models of two tools (OCD and CD-SEM tools) is performed using measured data from both tools, by creating a combined model.

The information measured by the secondary toolset (CD-SEM) is typically used as input constraint on the modeling analysis of the primary toolset (OCD). This is a so-called "sequential hybridization" of data from one toolset to another. While this sequential hybridization is generally successful, there are cases where it does not sufficiently or at all improve the measurement results. This is because a "threshold" parameter used to analyze CD-SEM images does not provide a reading of the CD value at a well-defined height of the structure being measured, but the CD value provided corresponds to ill-defined heights, correlated with other parameters of the structure such, as side wall angle (SWA).

WO 15/125127, also assigned to the assignee of the present application, describes the technique enabling to remove the above-mentioned correlation for better matching of data (between at least two tools, and to a reference system) and thus provide better Hybrid Metrology results. This technique utilizes the concept of a so-called "co-optimization" based hybridization, where, for example, image analysis parameters of a secondary tool (e.g. CD-SEM, X-ray tool) are modulated by profile information from a primary tool, OCD (scatterometry), while the OCD extracted profile is concurrently optimized (to minimize errors) through addition of the results (CD) of e.g. CD-SEM.

GENERAL DESCRIPTION

There is need for a novel approach for combining the information from a dimensional metrology information channel, namely OCD, and a material and dimensional sensitive information channel, namely Raman spectroscopy.

This is associated with another key trend in modern fabrication technology which involves the utilization of new materials, as well as more diverse phases and structural variations of these materials. Such variation of the materials properties often has an impact on other (e.g. optical/electrical) attributes, leading to an adverse effect on the optical dimensional metrology quality. For example, composition, stress\strain, doping and crystal phase can all have direct impact on the optical properties (complex refractive index, 'n&k') of a material. Without knowledge of these properties, the optical metrology solutions would be degraded.

In these situations, a metrology solution allowing material characterization at comparable throughput to that of the dimensional metrology tools is of high potential benefit. Moreover, the ability to separately distinguish between materials properties associated with different parts of the slack is of specific importance, in order to correctly 'guide' the optical metrology solution.

Yet another trend common to modern dimensional metrology is the need for additional, independent information channels, sensitive to the target structure dimensional characteristics. Adding more such channels provides supporting perspective on the measured structure, and allows dealing with their ever increasing complexity.

OCD is an extremely useful technique for dimensional characterization of nanostructures, heavily utilized during advanced semiconductor fabrication process. OCD is based on the acquisition of a set of reflected signal from the sample, at different wavelengths, polarizations, angles of incidence etc. These measurements are then compared to a corresponding set of modeled signals, representing the expected signal from some assumed structure. In this respect, OCD can only be used to characterize a known structure, for which the geometrical layout and material properties are roughly known. The assumed characteristics of the measured signal are then iteratively altered until fitting is obtained between the measurement and model.

Raman spectroscopy is also a widely used technique in diverse field of science and metrology. The Raman spectrum carries information on various properties of the probed sample. Most notably, different peaks in the spectrum correspond to different materials. When the measured target is comprised of material compounds (e.g. SiGe), specific peaks in the Raman spectrum would correspond to different atom pairs (e.g. Si—Si, Si—Ge and Ge—Ge).

In this connection, reference is made to FIG. 1 exemplifying the Raman spectrum from a thin SiGe layer deposited over Si (graph $S_1$), as well as pure (bulk) Si for reference (graph $S_2$). In the SiGe measurement, four peaks are clearly observed. The strong peak at 520 cm$^{-1}$ corresponds to Si—Si vibrations in the substrate. The three additional peaks correspond to Si—Si, Si—Ge and Ge—Ge pairs in the SiGe film. In the pure-Si reference spectrum, only the substrate Si—Si peak is observed. Thus, the presence of a SiGe layer gives rise to three additional peaks, associated with the vibrations of different atom pairs in the layer.

Methods for extracting information on concentration and stress from the positions of these peaks are well known in the literature. For example, a set of equations relating the positions of the three SiGe peaks with the Germanium composition and the layer stress is presented in the following publication: T. S. Percy et al., *Composition and strain in thin Si1-xGex virtual substrates measured by micro-Raman spectroscopy and x-ray diffraction*, J. App. Phys. 109, 033502 (2011).

Doping is another characteristic which affects the Raman spectrum. Carrier concentration, arising from the dopant distribution, affects the Raman signal and causes an additional (arguably small) shift in the Raman peaks. The level of doping can hence be incorporated into the fitting procedure, and concurrent assessment of doping level along with stress and composition is possible through monitoring peak locations (as described for example in the following publication A. Perez-Rodriguez et al., *Effect of stress and composition on the Raman spectra of etch-stop SiGeB layers*, J. Appl. Phys. 80, 15 (1996)).

The structure's properties such as composition, strain and doping, affect the optical properties of the structure. FIG. 2 shows an example for changes of optical properties with composition. Here, the real (solid lines) and imaginary (dashed lines) components of the refractive index of $Si_{1-x}Ge_x$ are presented for varying values of x (across the structure). Thus, the refractive index of $Si_{1-x}Ge_x$ (both real and imaginary components) varies as a function of the Ge concentration across the structure. During the interpretation of OCD measured data, such variations could greatly affect the interpretation sequence, and are often difficult to account for.

The present invention provides a novel approach for combining the information from OCD measurements (constituting dimensional metrology information channel) and Raman spectroscopy (constituting a material and dimensional sensitive information channel). To this, end, the invention utilizes a modeling engine and algorithmic tool, to correctly interpret and hybridize the information from these two channels. The modeling engine allows calculation of both OCD spectrum as well as Raman spectrum from a given sample, and consequently can provide feedback on whether the measurements are consistent or inconsistent with some assumed set of properties (geometry, material properties) of the measured device. The associated algorithmic tool allows an efficient optimization method to identify the best set of geometrical and\or material properties, which would minimize the measurement-to-model error.

According to one broad aspect of the invention, there is provided s method for use in measuring one or more characteristics of patterned structures. The method comprises: providing first and second measured data, wherein the first measured data is indicative of at least one Raman spectrum obtained from a patterned structure under measurements using at least one selected optical measurement scheme each with a predetermined configuration of at least one of illuminating and collected light conditions corresponding to said one or more characteristics to be measured; and the second measured data comprises at least one spectrum obtained from said patterned structure in Optical Critical Dimension (OCD) measurement session; processing the first measured and second measured data, and determining said one or more characteristics of the structure under measurements, wherein said processing comprises: applying model-based analysis to said at least one Raman spectrum and said at least one OCD spectrum, and determining said one or more characteristics of the patterned structure under measurements.

In some embodiments, the model-based analysis includes concurrently analyzing the at least one Raman spectrum and the at least one OCD spectrum and determining the one or more characteristics of the patterned structure under measurements.

Preferably, the first measured data is indicative of a number n (n>1) different Raman spectra obtained from the patterned structure under measurements using n different optical measurement schemes, respectively, with different configurations of the at least one of illuminating and collected light conditions corresponding to the one or more characteristics to be measured. In this case, the Raman and OCD spectra may also be analyzed concurrently; or alternatively, the n Raman spectra may be sequentially analyzed and a set of parameters of the patterned structure is deduced, enabling to use this set of the deduced parameters for interpreting the second measured indicative of the at least one OCD spectrum.

The parameter(s) of the structure calculated from the model-based analysis of the Raman spectral data may be indicative of dimensional configuration of the structure.

The characteristic(s) of the patterned structure that can be determined using this method includes: dimension and/or material composition and/or stress and/or crystallinity.

The one or more predetermined configurations of the illuminating and/or collected light conditions is/are defined by selecting one or more of the following: excitation wavelength; polarization; angles of incidence; azimuth.

When more than one Raman spectrum is used, the model-based analysis may include the following: for each i-th Raman spectrum, calculating distribution of Raman-contribution efficiency, $RCE_i(x,y,z)$, across at least part of the structure under measurements; analyzing one or more selected distributions of the Raman-contribution efficiency and determining a set of parameters of the patterned structure. The $RCE_i(x,y,z)$ is dependent on characteristics of the structure and the corresponding configuration of the illuminating and collected light conditions in the respective optical measurement scheme.

The invention also provides a control system for use in measuring one or more characteristics of patterned structures. The control system is configured for carrying out the above method and comprises a processor unit configured to receive and process the above described first and second measured data by applying thereto model-based analysis and determining the one or more characteristics of the patterned structure under measurements.

The invention further provides a measurement system for use in measuring one or more characteristics of patterned structures. The measurement system comprising: an optical measurement system configured and operable to perform optical measurements on a patterned structure using at least one selected optical measurement scheme each with a predetermined configuration of at least one of illuminating and collected light conditions corresponding to said one or more characteristics to be measured, and generating measured data indicative of spectral responses of the patterned structure comprising at least one Raman spectrum and at least one OCD spectrum; and the above-described control system configured for data communication with the optical measurement system to receive and process the measured data and determine the one or more characteristics of the patterned structure under measurements.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which:

FIG. 1 exemplifies the Raman spectrum from two samples, one being a thin SiGe layer deposited over Si, and the other being a pure bulk Si;

FIG. 2 exemplifies effect of changes in material composition across the structure on optical properties of the structure;

DETAILED DESCRIPTION OF EMBODIMENTS

The present invention provides a novel hybrid metrology technique which combines measurements obtained via a dimensional metrology information channel (OCD measurements) and a material and dimensional sensitive information channel (Raman spectroscopy).

The present invention provides a novel metrology method and device, configured to allow optimized Raman-metrology for the sample characteristics of interest, as well as dimensional metrology using OCD, which can be implemented on a single platform, or on different platforms which would share information during the fabrication process. Also, the present invention provides a set of modeling solutions (methods and systems) to allow correct utilization of these methods and degrees of freedom in the device/system configuration, as well as accurate interpretation of the Raman measurements.

The above two aspects of the invention can be used separately, with substantial potential benefit to either. Conversely, used together they can lead to significantly improved metrological performance, as will be discussed below.

The following is the description of model-based hybrid metrology utilizing Raman and OCD channels, according to some embodiments of the invention.

Raman spectroscopy represents a unique type of light-matter interaction. Different parts of the Raman spectrum have different responses to a change in the optical scheme, specifically: change(s) in illumination and collection polarizations/retardations, change(s) in illumination and collection angle(s) of incidence and pupils shape, wavefronts and focus.

As an example for the possible benefit from correct manipulation of one or more of these parameters, let us consider the issue of two-phonon background. As described previously, the Raman spectrum from pure bulk Si presents a sharp peak at about 520 $cm^{-1}$. An additional, very broad and significantly weaker, spectral peak is observed at 230 $cm^{-1}$-380 $cm^{-1}$. This weak Raman signal arises from a 2-phonon process.

In most cases, the weak Raman signal associated with the 2-photon process is not of interest for the metrology. However, this signal acts as a background signature which can significantly affect (and confound) the interpretation of the Raman spectrum. The relative intensity between the 1-phonon peaks and the 2-phonon peak can be modified by several orders of magnitude through correct control over the illumination and collection polarizations.

Figure 3:
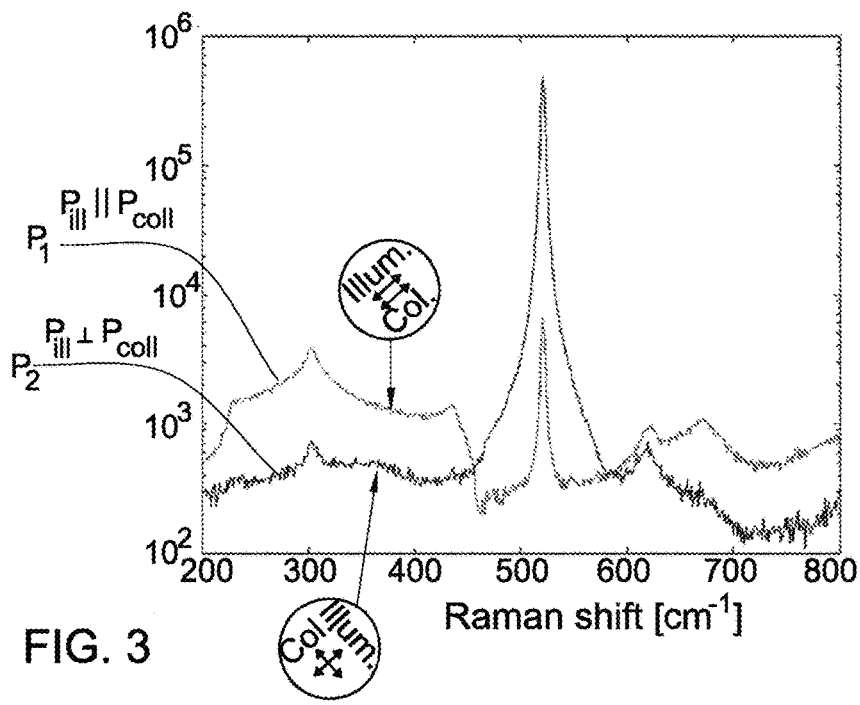
FIG. 3 exemplifies effect of polarization on relative intensity of the single-phonon and two-phonon peaks in Si.

This dependence is illustrated in FIG. 3, exemplifying effect of polarization on relative intensity of the single-phonon and two-phonon peaks in Si. Two graphs are shown $P_1$ and $P_2$, where two polarization configurations are presented, i.e. illumination and collection polarizations $P_{ill} \| P_{coll}$ (graph $P_1$) and $P_{ill} \perp P_{coll}$ (graph $P_2$). As shown in the figure, when the illumination and collection polarizations $P_{ill}$ and $P_{coll}$ are tuned perpendicular to each other, and both are oriented at 45° to the crystal lattice of a sample, a 3 orders of magnitude suppression of the 2-phonon peak is observed. Thus, by aligning the illumination polarization $P_{ill}$ in direction 45° to the crystal structure, and aligning the collection polarization $P_{coll}$ perpendicular to illumination polarization, the 2-phonon signal is significantly reduced, compared to having the polarizations co-aligned.

This is only one example for how correct polarization manipulation can greatly improve the signal quality and the ability to isolate important measurement components from those which are not of interest (of less interest). As will be described below, the same principle can be used to highlight sensitivity to specific parameters of interest.

Such a simple approach is not practical (and even might be impossible) to be applied to a measured target which is not a planar film but rather is structured. The electromagnetic field distribution inside a structure can be very complicated, and depends on the structure dimensions as well as material characteristics.

The present invention utilizes a model-based approach, such that the dependence of the Raman signal on dimensional properties can be deduced. In the invention, these two techniques allow of specific synergy, since they are both based on modeling the electromagnetic interaction with the sample and to a great extent can utilize the same calculation engines (or at least common modules of them).

This realization, namely that the Raman signal by itself carries strong and unique dependence on dimensional parameters, allows for a novel type of dimensional characterization. In this approach, both Raman and OCD measurement are obtained from the same target. Then, through appropriate modeling and algorithmic tools, the inverse problem of characterizing the critical dimensions of the measured structure, as well as some of its material characteristics, is solved (by fitting procedure). In this respect, the additional Raman spectroscopy information is considered as another information channel added to the optical scatterometry channels.

Figure 4:
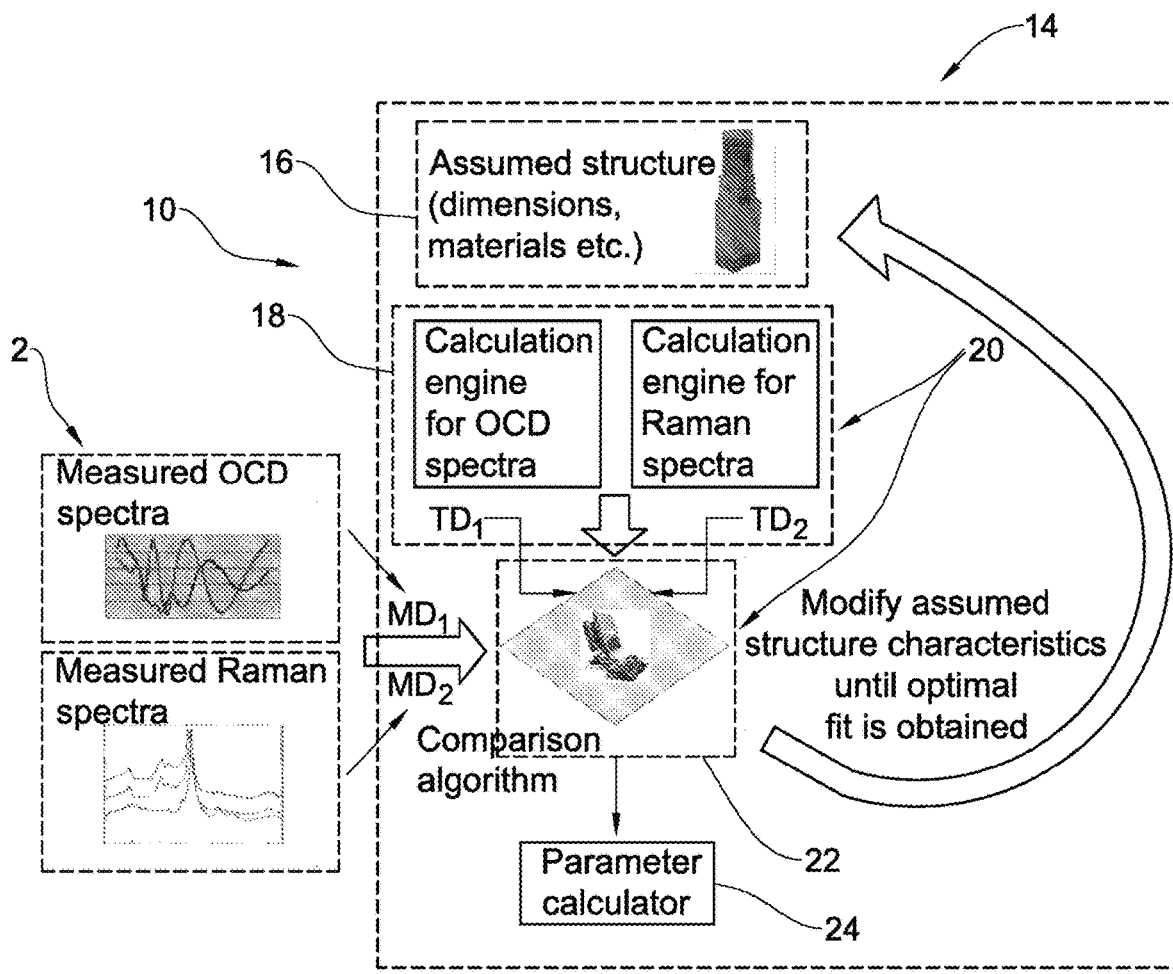
FIG. 4 schematically illustrates the configuration and operation of an exemplary metrology scheme/system of the invention utilizing both Raman and OCD information channels.

In this connection, reference is made to FIG. 4, schematically illustrating the configuration and operation of an exemplary metrology scheme/system 10 of the invention utilizing both Raman and OCD information channels. As shown in the figure, first and second measured data $MD_1$ and $MD_2$ are provided comprising, respectively data indicative of one or more Raman spectra and data indicative of one or more OCD spectra. The measured data may be provided directly from respective measurement units (on line or real-time mode), and/or from external storage device(s) considering off-line mode or a combination of on-line and off-line modes. This, reference number 12 designates a measured data provider system, which may be constituted by respective measurement units and/or external storage device(s), configured for transferring measured data in any known suitable data communication technique to a control system 14, where the measured data is processed.

Generally, each of the measured data $MD_1$ and $MD_2$ may include data indicative of one corresponding spectrum. Preferably, however, at least the Raman spectral data $MD_1$ includes a set of at least two different spectra obtained with different optical scheme configurations, defined by different condition(s) of illuminating and/or collecting light. Such conditions include one or more of the following: different wavelengths, polarization configurations, angles of incidence, azimuths, etc.

The control system 14 is generally a computer system configured for communication with measured data provider 12; and may also be configured for managing/controlling the measurements with different measurement schemes, as will be described more specifically further below. As shown in the present non-limiting example, the control system 14 includes a modelling utility 16 storing "theoretical" data about the structure under measurements, namely various parameters (dimensions, material compositions) of an 'assumed' structure configuration; and processor utility 20. The latter includes modelling modules 18 configured and operable to calculate theoretical Raman spectral data $TD_1$ and theoretical OCD spectral data $TD_2$ for a given assumed structure configuration; a comparison module 20; and a parameter calculator module 22.

The comparison module 20 is configured and operable for combining information from OCD and Raman spectroscopy in the measured data $MD_1$ and $MD_2$ and comparing these data with the theoretical data $TD_1$ and $TD_2$, and appropriately operating the modeling utility 16 and the modules 18 to vary the assumed structure parameters and recalculate the corresponding theoretical data to find the best fit condition; and a parameter calculator 22 that calculates the measured structure parameter(s) from the best fit modelled (theoretical) data. Thus, a corresponding set of calculated (theoretical) spectra is obtained, for some assumed structure. An algorithmic optimization tool is used to vary the properties of the modeled structure, until agreement is obtained between the calculated and measured spectra.

Figure 5:
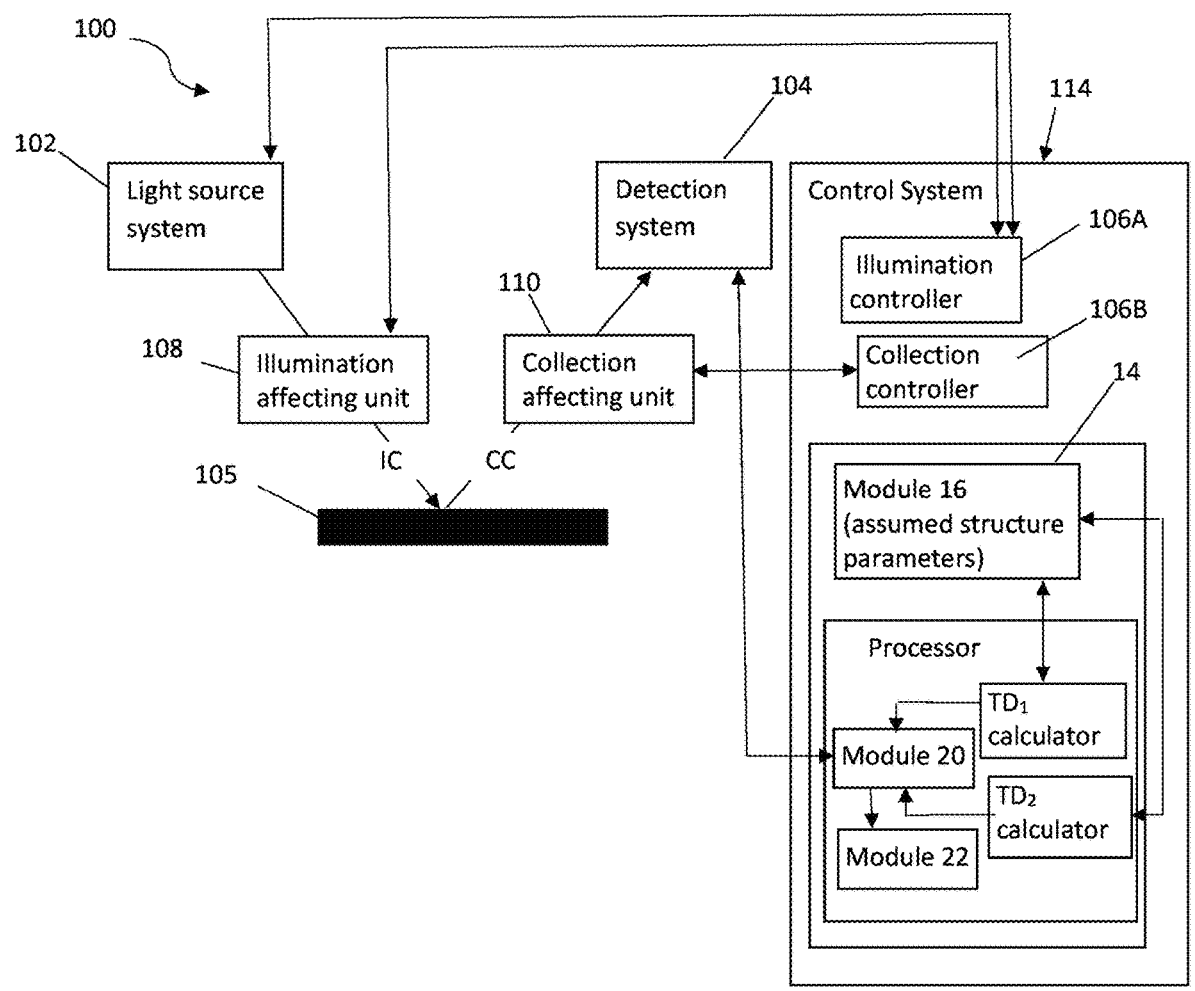
FIG. 5 is a block diagram of an exemplary system of the invention for implementing the hybrid metrology method of FIG. 4 while managing multiple optical measurement schemes.

FIG. 5 illustrates, by way of a block diagram of a system 100 of the invention for use in measuring on patterned structures using the hybrid metrology. System 100 includes a control system 146 which is configured to receive and process input measured data $MD_1$ indicative of multiple (generally at least two) Raman spectra measured on at least a part of a sample 105 using two or more measurement schemes implemented in an optical system; and receive and process input measured OCD data $MD_2$ indicative of OCD spectrum measured on at least a part of the sample 105 using a certain measurement scheme. In this example, the control system 114 is shown as being operable in on-line mode with respect to at least one of the Raman and OCD measurements, and is also configured for operating the optical measurement system(s) to controllably vary the measurements schemes to obtain said two or more Raman spectra corresponding to different condition(s) of illuminating and/or collected light. To this end, the control system 114 in addition to the above described control unit 14 includes an illumination controller 106A and/or a collection controller 106B.

The optical system includes a light source system 102 defining an illumination channel IC, and a detection system 104 defining a collection channel CC, and also includes a light affecting unit located in/associated with at least one of the illumination and collection channels. In this non limiting example, the system includes both a light illumination affecting unit 106 and a light collection affecting unit 108. The Illumination and collection affecting units are configured for affecting illumination and collection conditions. Such unit may include light propagation affecting optics for affecting the condition of light propagating along the respective channel. The illumination affecting unit 108 may include (e.g. in addition to the light propagation affecting optics) a controller for controlling operation of a light source system; alternatively or additionally such controller may be part of the control system 114. It should be understood that partially the same optical system may be shifted between Raman and OCD operational modes, or may be concurrently operated in both modes, or separate optical systems may be used. The illumination controller 106A is associated with the illumination affecting unit 108 and/or light source system 102. The collection controller 106B is associated with the collection affecting unit 110.

While it is often useful to have the same metrology target used for both measurement technologies (Raman and OCD), it could be beneficial to have separate test sites dedicated for each method. As these sites could share some important attributes (e.g. material composition, thicknesses) but have different other properties (e.g. line widths, pattern structure), the metrology could be greatly simplified on the one hand, but still allow fusion of the information from the different sites.

Several variations and modifications are possible for the above-described approach of the invention. For example, the use of the strengths and weaknesses of the combined technologies may be optimized. To this end, the comparison engine 20 used to combine information from OCD and Raman spectroscopy does not necessarily have to treat their respective information equivalently. For example, it is possible to use the Raman spectrum data, preferably using multiple different measurement schemes (i.e. different from one another in the illumination and/or light collection conditions) to obtain accurate information on material compositions, from which optical parameters (n and k) can be deduced via known relations (as shown in FIG. 2). Then, these optical parameters can be used in the OCD data analysis, as inputs to the calculation core, leading to significant improvement in the OCD performance.

Generally, it is often the case that some properties of the sample can be characterized well by one of the Raman and OCD technologies, other characteristics are better obtained through the other of these technologies, and some can benefit from both technologies. In this case, a multi-step analysis can be implemented, according to which each technology is first used in order to identify the parameter(s) which it can address by itself, and then the deduce characteristics as well as the combined information from both measured datasets is used to obtain the remaining parameters.

The use of a multitude of information channels leads to a plethora of possible channel configurations and combinations. Both the OCD and Raman channels can provide different information about the measured sample by using different measurement configurations, e.g. different polarization configurations (for both illumination and collection channels), controlling illumination and collection angles of incidence, sample azimuth, wavelengths etc. A dedicated methodology, possibly supported by a suitable algorithmic solution, is needed to choose the best combination of Raman and OCD channels. In this methodology, the respective sensitivities of each channel to the parameters of interest, correlations between sensitivities to different parameters as well as optical system configuration and productivity considerations (e.g. throughput, possible sample damage, etc.) can be taken into account.

Figure 6:
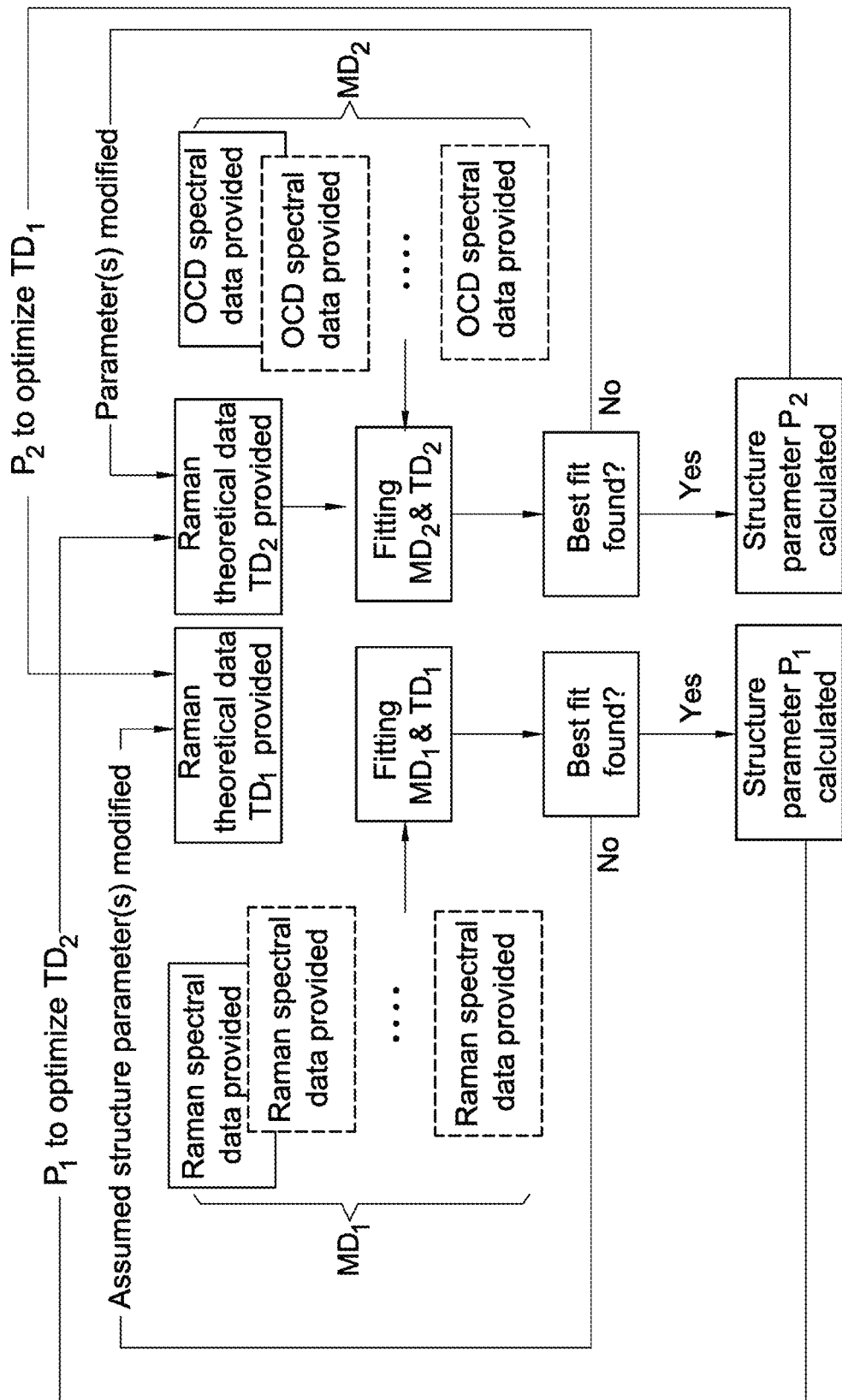
FIG. 6 is a flow diagram of an exemplary method of the invention for the hybrid metrology utilizing Raman spectroscopy and OCD.

The above is illustrated, in a self-explanatory manner in FIG. 6 showing a flow diagram of an exemplary method of the invention for the hybrid metrology utilizing Raman spectroscopy and OCD. In this example, one or more parameters $P_1$ of the structure being measured is/are calculated from model-and-fitting analysis of Raman measured data $MD_1$, preferably including multiple Raman spectra obtained using different measurement schemes, and the parameter(s) $P_1$ is/are used for optimizing the OCD model (theoretical data $TD_2$); and the OCD measured data $MD_1$ from the same structure (e.g. in the same measurement site or not) undergoes model-and-fitting analysis (e.g. using OCD theoretical data $TD_2$ optimized with parameter $P_1$), and one or more other structure parameters $P_1$ is/are calculated, which may be used for further optimizing the Raman theoretical data $TD_1$.

Figure 7:
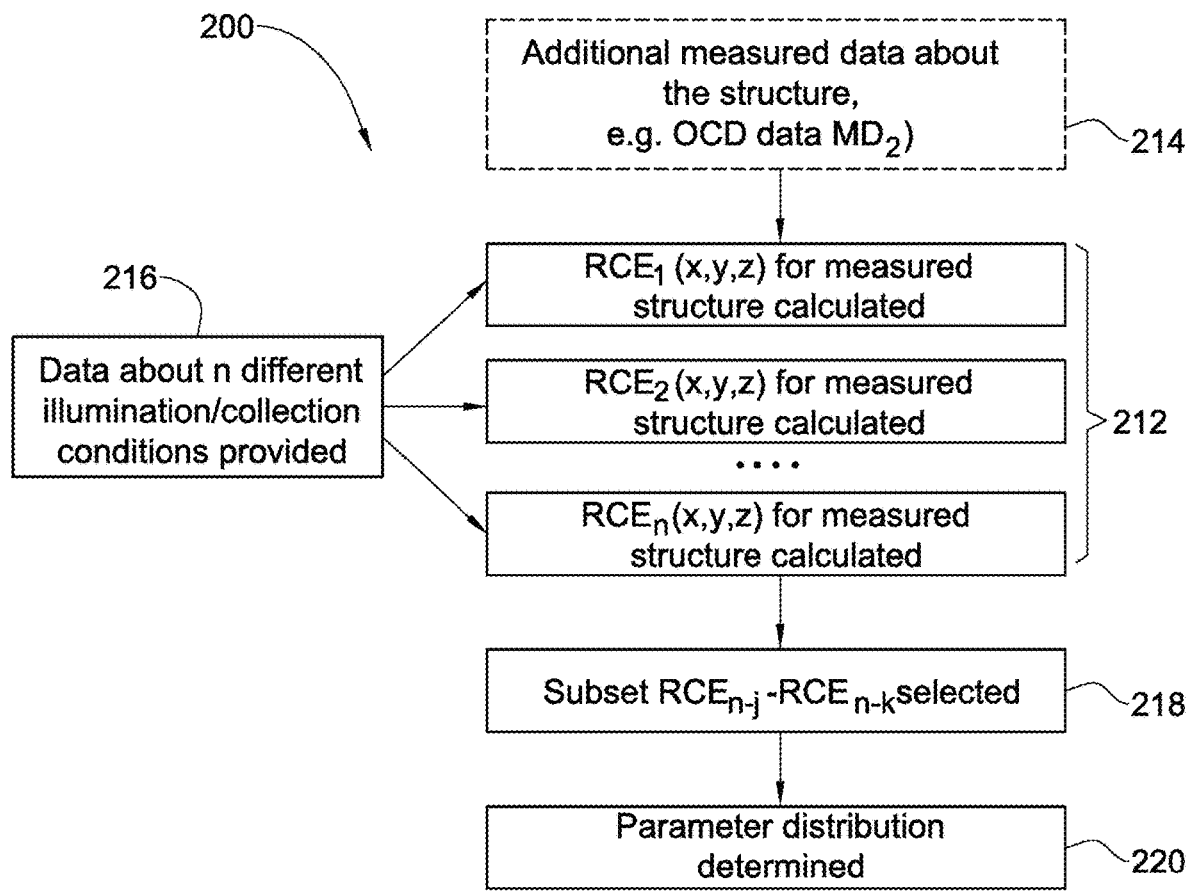
FIG. 7 exemplifies a method suitable to be used in the invention utilizing acquisition of a multiplicity of different information Raman channels, for obtaining multiple Raman spectra from the same structure/same measurement site using different optical measurement schemes.

Reference is made to FIG. 7 showing a flow diagram 200 of an exemplary method suitable to be used in the invention utilizing acquisition of a multiplicity of different information Raman channels, for obtaining multiple Raman spectra from the same structure/same measurement site using different optical measurement schemes. First, according to this method a 'Raman-contribution efficiency' (RCE) is defined as specifying the position-dependent contribution to the Raman signal. This property depends on the measured structure characteristics (dimensions, materials), the excitation wavelength and the characteristics of the illumination and collection channels (as will be described below). To clarify, the RCE represents the spatial distribution of the contribution to the Raman signal. It depends on the coupling of electromagnetic radiation into the structure, the excitation of the Raman signal inside the structure and coupling of the excited radiation to the detection system.

Raman-contribution efficiency for a measured structure is calculated (step 212). This calculation may be assisted (step 214) by information about the structure obtained/measured from other metrology tools and/or test sites, e.g. OCD\SEM\TEM to provide dimensional characterization, ellipsometry for material characterization, etc. Data about a variety of n measurement conditions is provided (step 216), and the Raman-contribution efficiency distributions across the structure $RCE_1(x,y,z)$, $RCE_2(x,y,z)$, ... $RCE_n(x,y,z)$ are calculated for the n measurement conditions, respectively, typically illumination/collection conditions. These may include different angles of incidence (AOIs), wavelengths, polarizations, pupil shaping options, etc. Each different i-th configuration provides a different distribution of the $RCE_i$ (x,y,z) across the structure. Then, a subset of the calculated configurations, $RCE_{n-j}$-$RCE_{n-k}$, where j and k are integers, j≥k, is chosen (step 218), so as to gain information on the measured parameter distribution across the structure. Deriving the parameter distribution inside the structure from the set of measurement (step 220) can be accomplished using standard algorithms (e.g. deconvolution methods).

As an example, a simple approach to implement such derivation can be based on a linear scheme: a set of measured Raman intensities $I_i$ is collected. Each is known to be related to the parameter distribution inside the structure through its RCE, namely:

$$I_i = \int RCE_i(x,y)P(x,y)dxdy.$$

By defining some spatial sampling of the measured structure, this relation can be written in matrix form:

$$I_i = M_{i,j} P_j \text{ or equivalently } \vec{I} = \hat{M}\vec{P}.$$

Here, the index j relates to different spatial locations and the index i relates to a different measurement. As both I and M are known (through the measurement and the modeling engine correspondingly), the spatial distribution of the parameter can be directly obtained using RMS solution:

$$\vec{P} = \hat{M}^{-1}\vec{I}.$$

Many other algorithmic methods are available, allowing more stable and well-controlled solutions.

This methodology can be applied to any measurable property, such as stress, composition, crystallinity, which are just a few non-limiting examples.

One capability of unique interest allowed by adding modeling capabilities to Raman spectroscopy is dimensional metrology. Indeed, such capabilities require a multifaceted modeling tool/methods, involving both comprehensive characterization of the electromagnetic field penetration into and out of the structure, as well as modeling of the Raman signal creation inside the structure. Such a path can provide highly sensitive information on the measured structure.

Evidence that dimensional factors affect the measured Raman signal are known in the literature, for example from the following publications: A. K. Arora et al., *Raman spectroscopy of optical phonon confinement in nanostructured materials*. J. of Raman Spectroscopy 38, 604 (2007); B. Kaleli et al., *Strain characterization of FinFETs using Raman spectroscopy*, Thin Solid Films 31497 (2013); T. Nuytten et al., *Edge-enhanced Raman scattering in narrow sGe fin field-effect transistor channels*, App. Phys. Lett. 106, 033107 (2015). On specific cases (e.g. nanowires), the Raman signal has been found to provide dimensional information on a dimensional characteristic of the structure (e.g. nanowire diameter [J. Liu et al., *Raman spectrum of array-ordered crystalline silicon nanowires*, Physica E 23, 221 (2004); R. P. Wang et al., *Raman spectral study of silicon nanowires: High-order scattering and phonon confinement effects*, Phys. Rev. B 61, 16827 (2000)]).

However, through general modeling capabilities, akin to that utilized in OCD metrology, a similar methodology to OCD can be used to solve the inverse-problem of deducing the dimensional properties from the measurements. In this method, the measured signal is compared to that calculated from the modeling tool, for some assumed properties (dimensions, materials) of the test structure. When good fit is obtained between the measured and calculated signal, it is deduced that the measured structure has similar characteristics to the corresponding calculated one. Similarly to common practice in OCD metrology, the theoretical Raman signals can be calculated in real-time ('real-time regression') or pre-calculated to form a parameter-dependent 'library' of theoretical spectra. Such analysis of the Raman spectrum can be used in conjunction with other metrology methods (e.g. OCD), to break correlation between parameters and improve sensitivity.

What is claimed is:

1. A method for use in measuring one or more characteristics of patterned structures, the method comprising:
   providing first and second measured data,
      wherein the first measured data is indicative of at least one Raman spectrum obtained from a patterned structure under measurements, and
      wherein the second measured data comprises at least one Optical Critical Dimension (OCD) spectrum obtained from said patterned structure in an OCD measurement session;
   obtaining a set of one or more parameters of the patterned structure by analyzing the at least one Raman spectrum; and
   determining measurements of said one or more characteristics of the patterned structure under measurements by analyzing the at least one OCD spectrum using the set of one or more parameters,
   wherein the first and second measured data are obtained using different measurement configurations having different values of any of wavelength, polarization, angle of incidence, and sample azimuth, and
   wherein the different values are predetermined in accordance with any of a) predefined sensitivities of any of said channels to any predefined parameter of interest of the patterned structure, b) correlations between predefined sensitivities to different parameters of the patterned structure, c) a predefined optical system configuration of any of said channels, and d) predefined productivity considerations including any of predefined throughput values and predefined risk values of possible sample damage.

2. The method according to claim 1, wherein the first and second measured data are obtained using different optical channels having different types of illumination and different collection channels having different types of detectors.

3. The method according to claim 1, wherein said first measured data is indicative of a number n (n>1) different Raman spectra obtained from the patterned structure under measurements using n different optical measurement schemes, respectively, with different configurations of the at least one of illuminating and collected light conditions corresponding to said one or more characteristics to be measured.

4. The method according to claim 3, wherein said analyzing the at least one Raman spectrum comprises sequentially analyzing said n Raman spectra.

5. The method according to claim 3, wherein said analyzing the at least one Raman spectrum comprises: for each i-th Raman spectrum of said n Raman spectra, calculating distribution of Raman-contribution efficiency, $RCE_i(x,y,z)$, across at least part of the structure under measurements, the $RCE_i(x,y,z)$ being dependent on characteristics of the structure and a corresponding configuration of at least one of illuminating and collected light conditions in a respective optical measurement scheme, analyzing one or more selected distributions of the Raman-contribution efficiency, and determining the set of parameters of the patterned structure.

6. The method according to claim 5, comprising using said set of the determined parameters for interpreting the second measured data indicative of the at least one OCD spectrum and determining said one or more characteristics of the structure from the second measured data.

7. The method according to claim 1, wherein any of said parameters of the patterned structure obtained by analyzing the at least one Raman spectrum is indicative of dimensional configuration of the structure.

8. The method according to claim 1, wherein said one or more characteristics of the patterned structure comprises at least one of the following: dimension, material composition, stress, crystallinity.

9. A control system for use in measuring one or more characteristics of patterned structures, the control system comprising:
   a processor unit configured to
      receive and process first and second measured data,
         wherein the first measured data is indicative of at least one Raman spectrum obtained from a patterned structure under measurements, and
         wherein the second measured data comprises at least one Optical Critical Dimension (OCD) spectrum obtained from said patterned structure in an OCD measurement session,
      obtain a set of one or more parameters of the patterned structure by analyzing the at least one Raman spectrum, and
      determine measurements of said one or more characteristics of the patterned structure under measurements by analyzing the at least one OCD spectrum using the set of one or more parameters,
   wherein the first and second measured data are obtained using different measurement configurations having different values of any of wavelength, polarization, angle of incidence, and sample azimuth, and
   wherein the different values are predetermined in accordance with any of a) predefined sensitivities of any of said channels to any predefined parameter of interest of the patterned structure, b) correlations between predefined sensitivities to different parameters of the patterned structure, c) a predefined optical system configuration of any of said channels, and d) predefined productivity considerations including any of predefined throughput values and predefined risk values of possible sample damage.

10. The control system according to claim 9, wherein the first and second measured data are obtained using different optical channels having different types of illumination and different collection channels having different types of detectors.

11. The control system according to claim 9, wherein said first measured data is indicative of a number n (n>1) different Raman spectra obtained from the patterned structure under measurements using n different optical measurement schemes, respectively, with different configurations of the at least one of illuminating and collected light conditions corresponding to said one or more characteristics to be measured.

12. The control system according to claim 11, wherein said processor is configured to analyze the at least one Raman spectrum comprises sequentially analyzing said n Raman spectra.

13. The control system according to claim 11, wherein said processor is configured to analyze the at least one Raman spectrum by, for each i-th Raman spectrum of said n Raman spectra, calculating distribution of Raman-contribution efficiency, $RCE_i(x,y,z)$, across at least part of the structure under measurements, the $RCE_i(x,y,z)$ being dependent on characteristics of the structure and a corresponding configuration of at least one of illuminating and collected light conditions in a respective optical measurement scheme, analyzing one or more selected distributions of the Raman-contribution efficiency, and determining the set of parameters of the patterned structure.

14. The control system according to claim 13, wherein the processor is configured to use said set of the determined parameters for interpreting the second measured data indicative of the at least one OCD spectrum and determining said one or more characteristics of the structure from the second measured data.

15. The control system according to claim 9, wherein any of said parameters of the patterned structure obtained by analyzing the at least one Raman spectrum is indicative of dimensional configuration of the structure.

16. The control system according to claim 9, wherein said one or more characteristics of the patterned structure comprises at least one of the following: dimension, material composition, stress, crystallinity.

17. A system for use in measuring one or more characteristics of patterned structures, the system comprising:
an optical measurement system configured and operable to perform optical measurements on a patterned structure and thereby generate first and second measured data,
wherein the first measured data is indicative of at least one Raman spectrum obtained from the patterned structure, and
wherein the second measured data comprises at least one Optical Critical Dimension (OCD) spectrum obtained from the patterned structure; and
the control system of claim 9 configured for data communication with the optical measurement system to receive and process the measured data by
obtaining a set of one or more parameters of the patterned structure by analyzing the at least one Raman spectrum, and
determining measurements of said one or more characteristics of the patterned structure under measurements by analyzing the at least one OCD spectrum using the set of one or more parameters,
wherein the first and second measured data are obtained using different measurement configurations having different values of any of wavelength, polarization, angle of incidence, and sample azimuth, and
wherein the different values are predetermined in accordance with any of a) predefined sensitivities of any of said channels to any predefined parameter of interest of the patterned structure, b) correlations between predefined sensitivities to different parameters of the patterned structure, c) a predefined optical system configuration of any of said channels, and d) predefined productivity considerations including any of predefined throughput values and predefined risk values of possible sample damage.

18. The system according to claim 17, wherein the first and second measured data are obtained using different optical channels having different types of illumination and different collection channels having different types of detectors.

19. The system according to claim 17, wherein said first measured data is indicative of a number n (n>1) different Raman spectra obtained from the patterned structure under measurements using n different optical measurement schemes, respectively, with different configurations of the at least one of illuminating and collected light conditions corresponding to said one or more characteristics to be measured.

20. The system according to claim 19, wherein said processor is configured to analyze the at least one Raman spectrum comprises sequentially analyzing said n Raman spectra.

21. The system according to claim 19, wherein said processor is configured to analyze the at least one Raman spectrum by, for each i-th Raman spectrum of said n Raman spectra, calculating distribution of Raman-contribution efficiency, $RCE_i(x,y,z)$, across at least part of the structure under measurements, the $RCE_i(x,y,z)$ being dependent on characteristics of the structure and a corresponding configuration of at least one of illuminating and collected light conditions in a respective optical measurement scheme, analyzing one or more selected distributions of the Raman-contribution efficiency, and determining the set of parameters of the patterned structure.

22. The system according to claim 21, wherein the processor is configured to use said set of the determined parameters for interpreting the second measured data indicative of the at least one OCD spectrum and determining said one or more characteristics of the structure from the second measured data.

23. The system according to claim 17, wherein any of said parameters of the patterned structure obtained by analyzing the at least one Raman spectrum is indicative of dimensional configuration of the structure.

24. The system according to claim 17, wherein said one or more characteristics of the patterned structure comprises at least one of the following: dimension, material composition, stress, crystallinity.

\* \* \* \* \*